(12) United States Patent
Van De Ven et al.

(10) Patent No.: US 9,753,381 B2
(45) Date of Patent: Sep. 5, 2017

(54) SUBSTRATE TABLE SYSTEM, LITHOGRAPHIC APPARATUS AND SUBSTRATE TABLE SWAPPING METHOD

(71) Applicant: ASML Netherlands B.V., Veldhoven (NL)

(72) Inventors: Bastiaan Lambertus Wilhelmus Marinus Van De Ven, Rosmalen (NL); Antonius Franciscus Johannes De Groot, Someren (NL); Christiaan Alexander Hoogendam, Westerhoven (NL); Erik Roelof Loopstra, Eindhoven (NL); Hans Butler, Best (NL)

(73) Assignee: ASML NETHERLANDS B.V., Veldhoven (NL)

( * ) Notice: Subject to any disclaimer, the term of this patent is extended or adjusted under 35 U.S.C. 154(b) by 138 days.

(21) Appl. No.: 14/388,773

(22) PCT Filed: Feb. 15, 2013

(86) PCT No.: PCT/EP2013/053084
§ 371 (c)(1),
(2) Date: Sep. 26, 2014

(87) PCT Pub. No.: WO2013/143777
PCT Pub. Date: Oct. 3, 2013

(65) Prior Publication Data
US 2015/0153661 A1    Jun. 4, 2015

Related U.S. Application Data

(60) Provisional application No. 61/616,177, filed on Mar. 27, 2012.

(51) Int. Cl.
G03F 7/20       (2006.01)
G03F 9/00       (2006.01)
H02K 41/02      (2006.01)

(52) U.S. Cl.
CPC ...... *G03F 7/70758* (2013.01); *G03F 7/70716* (2013.01); *G03F 7/70725* (2013.01);
(Continued)

(58) Field of Classification Search
CPC ............ G03F 7/70758; G03F 7/70716; G03F 7/70725; G03F 7/70733; G03F 9/70
See application file for complete search history.

(56) References Cited

U.S. PATENT DOCUMENTS

2003/0030402 A1\* 2/2003 Binnard ................ G03F 7/707
                                                      318/649
2004/0066497 A1   4/2004 Koide
(Continued)

FOREIGN PATENT DOCUMENTS

JP   2004-134456   4/2004
JP   2008-147635   6/2008
(Continued)

OTHER PUBLICATIONS

Japanese Office Action mailed Aug. 4, 2015 in corresponding Japanese Patent Application No. 2015-502166.

*Primary Examiner* — Michelle M Iacoletti
(74) *Attorney, Agent, or Firm* — Pillsbury Winthrop Shaw Pittman LLP

(57) ABSTRACT

A substrate table system includes a substrate table and a dual directional motor for moving the substrate table in a plane of movement that is defined by a first direction and a second direction. The dual directional motor includes: a first pusher structure extending in the first direction, the substrate table being movable in respect of the first pusher structure, the
(Continued)

first pusher structure and the substrate table being arranged to cooperate to form a first motor to exert a force between the first pusher structure and the substrate table in the first direction; and a second pusher structure extending in the first direction, the substrate table being movable in respect of the second pusher structure, the second pusher structure and the substrate table to cooperate to form a second motor to exert a force between the second pusher structure and the substrate table in the second direction.

11 Claims, 11 Drawing Sheets

(52) U.S. Cl.
CPC ............ *G03F 7/70733* (2013.01); *G03F 9/70* (2013.01); *H02K 41/02* (2013.01)

(56) References Cited

U.S. PATENT DOCUMENTS

| | | |
|---|---|---|
| 2008/0158531 A1 | 7/2008 | Kiuchi |
| 2009/0219503 A1* | 9/2009 | Li .................... G03F 7/70733 |
| | | 355/74 |

FOREIGN PATENT DOCUMENTS

| | | |
|---|---|---|
| JP | 2009-537969 | 10/2009 |
| WO | 98/40791 | 9/1998 |
| WO | 01/18944 | 3/2001 |
| WO | 2008/011766 | 1/2008 |
| WO | 2008/037131 | 4/2008 |

* cited by examiner

SUBSTRATE TABLE SYSTEM, LITHOGRAPHIC APPARATUS AND SUBSTRATE TABLE SWAPPING METHOD

CROSS-REFERENCE TO RELATED APPLICATIONS

This application is the U.S. national phase entry of International Patent Application No. PCT/EP20131053084, filed Feb. 15, 2013, which claims the benefit of priority from U.S. provisional application 61/616,177 which was filed on Mar. 27, 2012, and which are incorporated herein in their entirety by reference.

FIELD

The present invention relates to a substrate table system, a lithographic apparatus comprising such substrate table system and a method for swapping a substrate table.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

At present, in lithographic applications, two different types of motor configurations are used to move a substrate table (also identified as substrate stage) that is configured to hold the substrate.

A first type is disclosed in WO98/40791 A1 which is enclosed herewith in its entirety by reference. In this configuration, the substrate table is supported by a base plate, such as stone plate, the substrate table being movable over a top surface of the base plate, for example carried by air bearings, the top surface defining an X-Y horizontal plane. An Y-beam, extends along the X-direction. Movement of the Y-beam in the Y direction provides for a course positioning (i.e. a long stroke) of the substrate table in Y-direction. An X-motor is provided at the Y-beam, in order to move the substrate table in X-direction along the Y-beam, thereby providing a coarse positioning (i.e. a long stroke) of the substrate table in the X-direction. A fine positioning is provided by short stroke actuators that move the substrate table in respect of the X-motor. A performance in terms of maximum bandwidth of such configuration is largely limited by a stiffness of the Y-beam: resonances occurring in the Y-beam may limit a maximum performance in terms of acceleration, settling time, etc.

A second type is disclosed in WO01/18944 A1 which is enclosed herewith in its entirety by reference. In this configuration, the substrate table moves over a magnet plate, the magnets in combination with coils provided in the substrate table allow an actuation of the substrate table in 6 degrees of freedom. Although this configuration has many benefits, such as allowing to operate in vacuum (no air bearings to support the substrate table required), disturbance forces and disturbance torques on other parts of the lithographic apparatus may occur as the magnet plate in combination with the coils in the substrate table may result in propelling forces on the substrate table that are below a center of gravity of the substrate table.

SUMMARY

It is desirable to provide a substrate table system allowing a high bandwidth.

According to an embodiment of the invention, there is provided a substrate table system comprising a substrate table and a dual directional motor for moving the substrate table in a horizontal plane of movement, the plane of movement being defined by a first direction and a second direction perpendicular to the first direction, the dual directional motor comprising:

a first pusher structure extending in the first direction, the substrate table being movable in respect of the first pusher structure, the first pusher structure and the substrate table being arranged to cooperate so as to form a first motor arranged to exert a force between the first pusher structure and the substrate table in the first direction; and a second pusher structure extending in the first direction, the substrate table being movable in respect of the second pusher structure (along the first and second directions), the second pusher structure and the substrate table being arranged to cooperate so as to form a second motor arranged to exert a force between the second pusher structure and the substrate table in the second direction.

In another embodiment of the invention, there is provided a lithographic apparatus comprising a substrate table system according to an embodiment of the invention.

According to a further embodiment of the invention, there is provided a method of swapping a substrate table in a dual stage lithographic apparatus comprising a measurement area and an exposure area, a border between the measurement area and the expose area extending in a first direction, the method comprising: positioning one of the substrate tables under a projection system of the lithographic apparatus, moving the other one of the substrate tables from the measure area to the expose area, and positioning the other one of the substrate tables in the first direction adjacent the first substrate table; synchronously moving the first and second substrate tables in the first direction to a position wherein the other one of the substrate tables is positioned under the projection system, moving the one of the substrate tables from the exposure area to the measurement area.

BRIEF DESCRIPTION OF THE DRAWINGS

Embodiments of the invention will now be described, by way of example only, with reference to the accompanying schematic drawings in which corresponding reference symbols indicate corresponding parts, and in which.

Throughout the figures, the same or similar reference symbols refer to the same of similar elements.

DETAILED DESCRIPTION

Figure 1:
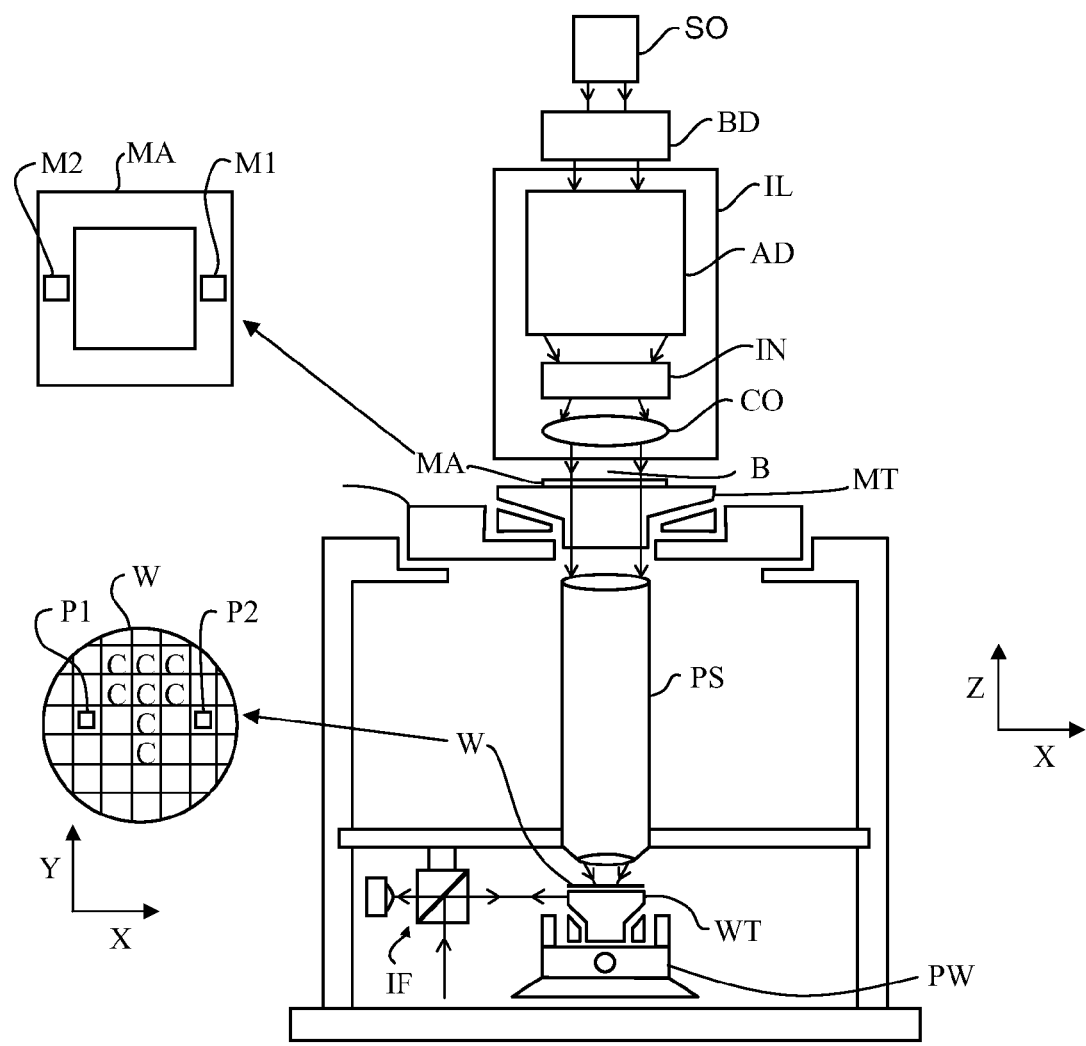
FIG. 1 depicts a lithographic apparatus in which an embodiment of the invention may be provided.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support structure or patterning device support (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The patterning device support structure can use mechanical, vacuum, electrostatic or other clamping techniques to hold the patterning device. The patterning device support structure may be a frame or a table, for example, which may be fixed or movable as required. The patterning device support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support structure (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support structure (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support structure (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support structure (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support structure (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
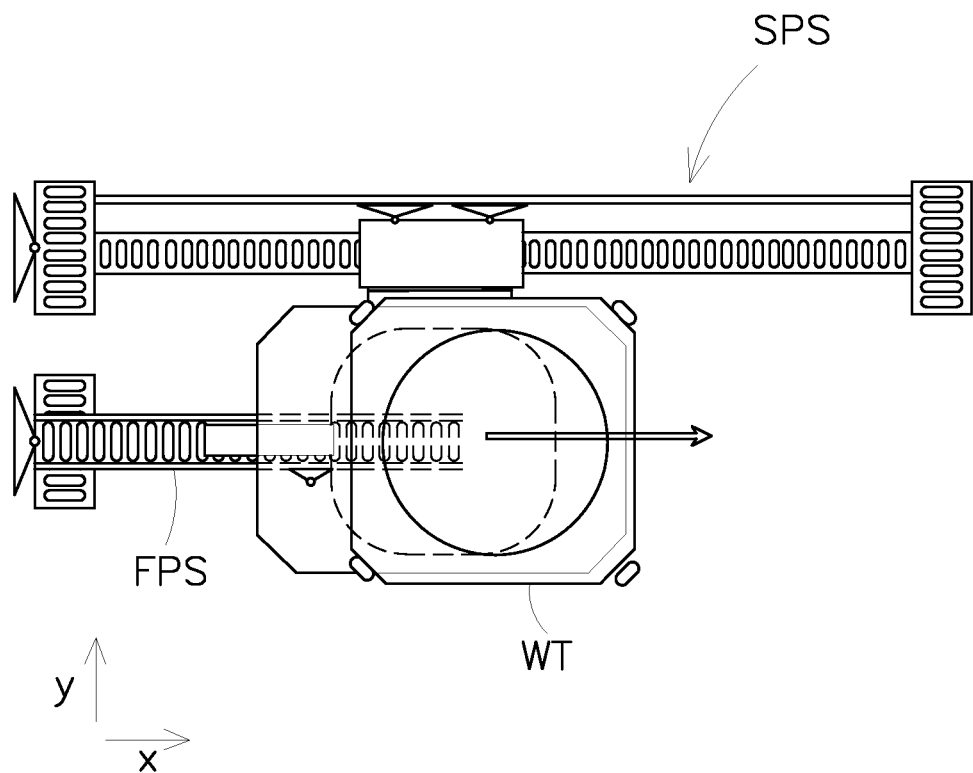
FIG. 2 depicts a highly schematic top view of a substrate table system according to an embodiment of the invention.

FIG. 2 depicts a highly schematic top view of a substrate table system according to an embodiment of the invention. The substrate table system comprises a substrate table WT which is supported by a base surface, such as a surface of a stone element. The substrate table is movable over the base surface hence forming a plane of movement defined by an X-direction (also referred to as a first direction) and a Y direction (also referred to as a second direction). The substrate table system comprises a first pusher structure FPS that extends in the X direction. The substrate table WT is movable in respect of the first pusher structure FPS using a first motor, which will be explained in some more detail below. The first motor when actuated exerts a force onto the substrate table. A second pusher structure SPS extends in the X direction adjacent to the substrate table, i.e. along a side of the substrate table that extends in the first direction. The substrate table is movable in the first (X) direction along the second pusher structure so as to allow the substrate table to move in the first direction when propelled by the first motor provided in the first pusher structure. A second motor is provided to exert a force onto the substrate table in respect of the second pusher structure in the second direction. The configuration as depicted in FIG. 2 may allow that the first motor exerts a force onto substantially a center of gravity of the substrate table and/or that the second motor exerts a force onto substantially a center of gravity of the substrate table. In order to provide a large range of movement in the first direction, parts of the second motor comprised in the second pusher structure may extend along a substantial part of a length of the second pusher structure. The first pusher structure may extend into a suitable opening of the substrate table. The first pusher structure may be movably connected to a guiding frame GF at an end thereof, a motor being provided to move the first pusher structure along the guiding frame in the second direction. Likewise, the second pusher structure may be movably connected to guiding frame GF, in this embodiment at both ends thereof, respective motors being provided to move the second pusher structure along the guiding frame in the second direction. As a result, a long stroke (coarse) positioning of the substrate table in the second direction may be provided by moving the second pusher structure, and letting the first pusher structure appropriately follow, the second pusher structure thereby exerting a force onto the substrate table (e.g. via the second motor). It is noted that FIG. 2 depicts the substrate table WT in two positions along the horizontal (i.e. first, x) direction, the substrate table WT being actuated from the one to the other position using an exerting a force by the first motor associated with the first pusher structure FPS. It is noted that what in and in relation to the FIG. 2 and further is identified as "the substrate table" may comprise further positioning devices, for example an accurate, short stroke positioning of the substrate table. In other words, the first and second motor associated with the first and second pusher structure may provide for an immediate of mediate (via an additional short stroke substrate positioning arrangement) actuation of the substrate.

The concept disclosed here, in addition to allowing the forces to be exerted by the first and second motor in a center of gravity of the substrate table, also allows a high bandwidth. Firstly, as the first pusher structure exerts a force on the substrate table in the first direction, i.e. in the same direction into which the first pusher structure extends, resonance mode effects in the first pusher structure may be avoided to a large extent. Secondly, the second pusher structure is connected to the substrate table via the second motor. In an embodiment, the second motor is a contactless motor, such as a Lorentz motor. As a result, any resonance mode of the second pusher structure, that would in the state of the art translate into a movement of position inaccuracy of the substrate table, may be decoupled from the substrate table. As a result, a high bandwidth may be achieved and the second pusher structure may be constructed relatively lightweight which may tend to have a positive effect on the bandwidth. Also, unlike the known motor configuration with the large magnet plate, a large force in vertical direction may not be generated with the configuration according to the invention, thereby exhibiting a higher degree of inherent safety. Also, compared with such known configuration, less magnets are required, possibly resulting in a reduction of material cost. It is noted that the first and second motors may comprise any suitable type of actuator.

In the example depicted in FIG. 2, the second pusher structure may be formed by a structure similar to a so called Y-beam in the conventional motor as described in WO98/40791 A1. An alternative is depicted and will be described with reference to FIGS. 3-4 below.

Figure 3:
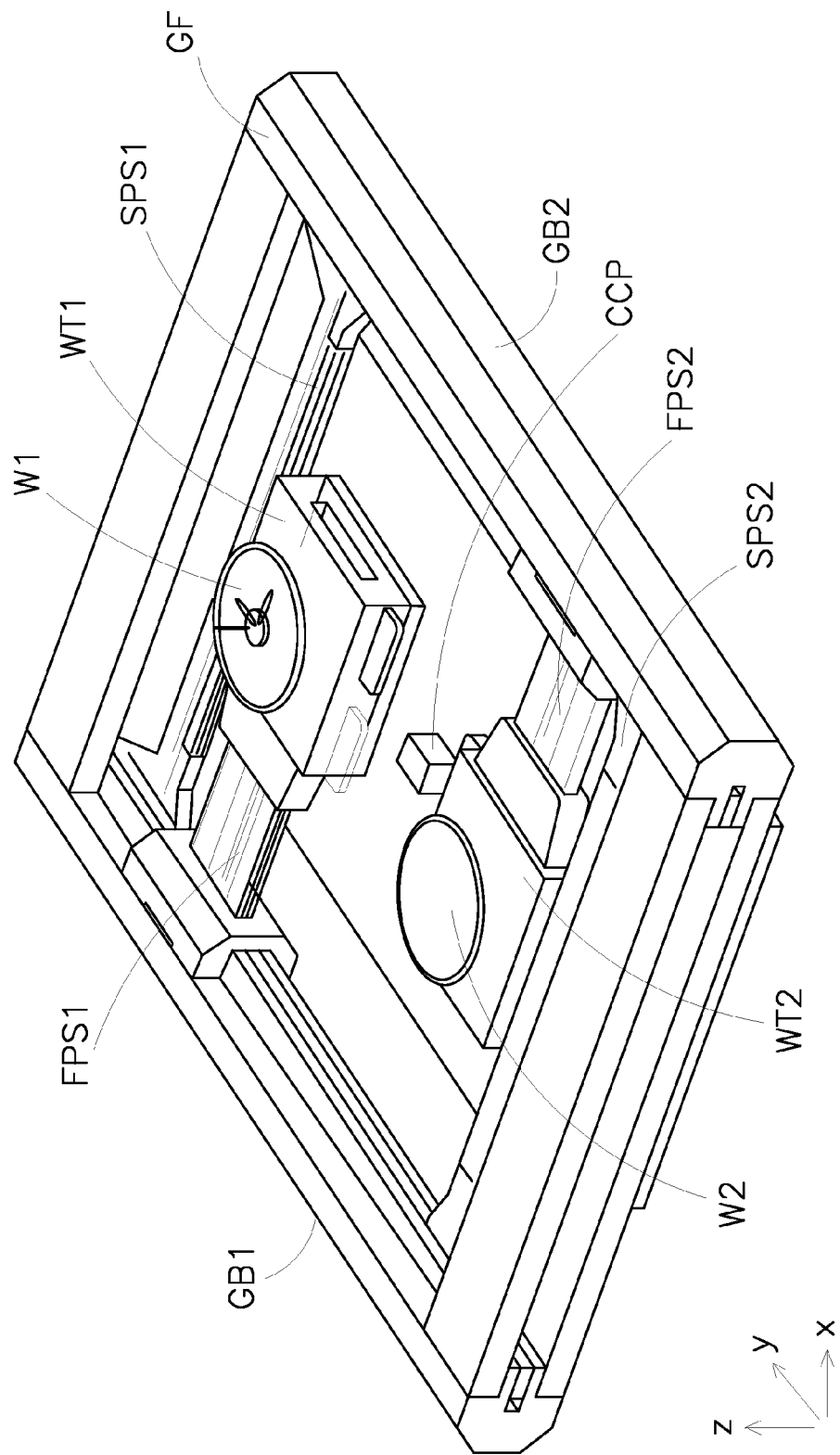
FIG. 3 depicts a perspective view of a substrate table system according to an embodiment of the invention.

FIG. 3 depicts a perspective view of a dual stage substrate table system (i.e. comprising dual substrate table systems) as may be used in a dual stage lithographic apparatus. Each of the substrate table systems being constructed in accordance with the principles set forward in relation to the embodiment depicted in FIG. 2. A guiding frame GF is provided to which both of the substrate tables are movably connected. A first one of the substrate tables WT1 to hold a substrate W1 is associated with corresponding first pusher structure FPS1 and second pusher structure SPS1. A force in the first direction is exerted onto substrate table WT1 in respect of first pusher structure FPS1 by motor M1, while a force in the second direction between the substrate table and the second pusher structure is exerted by second motor M2. The second one of the substrate tables WT2 to hold substrate W2 is associated with corresponding first FPS2 and second SPS2 pusher structures. The first substrate table WT1 may for example move in a measure area where a flatness measurement of a surface of the substrate is performed, while the second substrate table for example moves in an exposure area where exposing the substrate to a patterned beam of radiation may be performed. The substrate tables (WT1, WT2) are arranged between the second pusher structures (SPS1, SPS2), i.e. the second pusher structures of substrate tables are each provided at a side of the respective substrate table that faces away (seen in the second direction) from the other one of the substrate tables, so that a maximum range of movement may be provided and collision of the second support structures to e.g. to the other substrate table may be largely avoided. The first pusher structure of each substrate table extends to approximately a center of the dual substrate table system, so that, as will be described below, the substrate tables may be arranged next to each other seen as in the first direction, allowing e.g. a swap to be performed, as will be described in more detail below. A center crash pole CCP may further be provided (e.g. having a height below the second pusher structures SPS1, SPS2, so as to prevent a crash of the substrate tables while avoiding a limitation of the range of the movement of second pusher structures). The first and second motors may each be contactless motors, such as Lorentz motors, so that a pick up of resonances of the first respectively second pusher structures by the substrate tables may be prevented to a large extent. Likewise, the motors that drive the first and second pusher structures in respect of the guiding beams GB1, GB2 of the guiding frame GF may be contactless motors, such as Lorentz motors. For each of the motors, a magnet is provided in a stationary part, while coils are provided in the moving parts (however, the other way around would be possible too). The first pusher structure, in a cross sectional view, is provided with recesses along the first direction on either side, magnets being provided along a length of the recesses, the co-operating coils being provided in a corresponding projection of the substrate table, thus forming the first motor. Likewise, a recess is provided in the second pusher structure, extending in the first direction along a side of the second pusher structure facing the substrate table. Similarly, magnets are provided along the recess while coils are provided in a corresponding projection of the substrate table, the magnets and coils being configured to generate a force (when powered) in the second direction, thus forming the second motor. In order to provide a large range of movement, the recess and corresponding magnets may extend along a length of the second pusher beam. The projection and coils to form the second motor may be provided on either side of the substrate table (i.e. the side facing the second pusher structure and the side facing away from the second pusher structure), so as to allow swapping, as will be explained below. Furthermore, the second motor M2 may be formed by two coils (e.g. two coils on both respective sides of the substrate table on each side the coils being spaced apart in the first direction), to allow a rotational component in the forces, in this example a torque about a vertical axis (i.e. an axis perpendicular to the first and second directions). Similar motor configurations, whereby magnets are provided in a recess and coils in a protrusion extending in the recess, are formed in the first and second pusher structure and the guiding frame to form motors to move the first and second pusher structures in respect of the guiding frame GF.

Figure 4A:
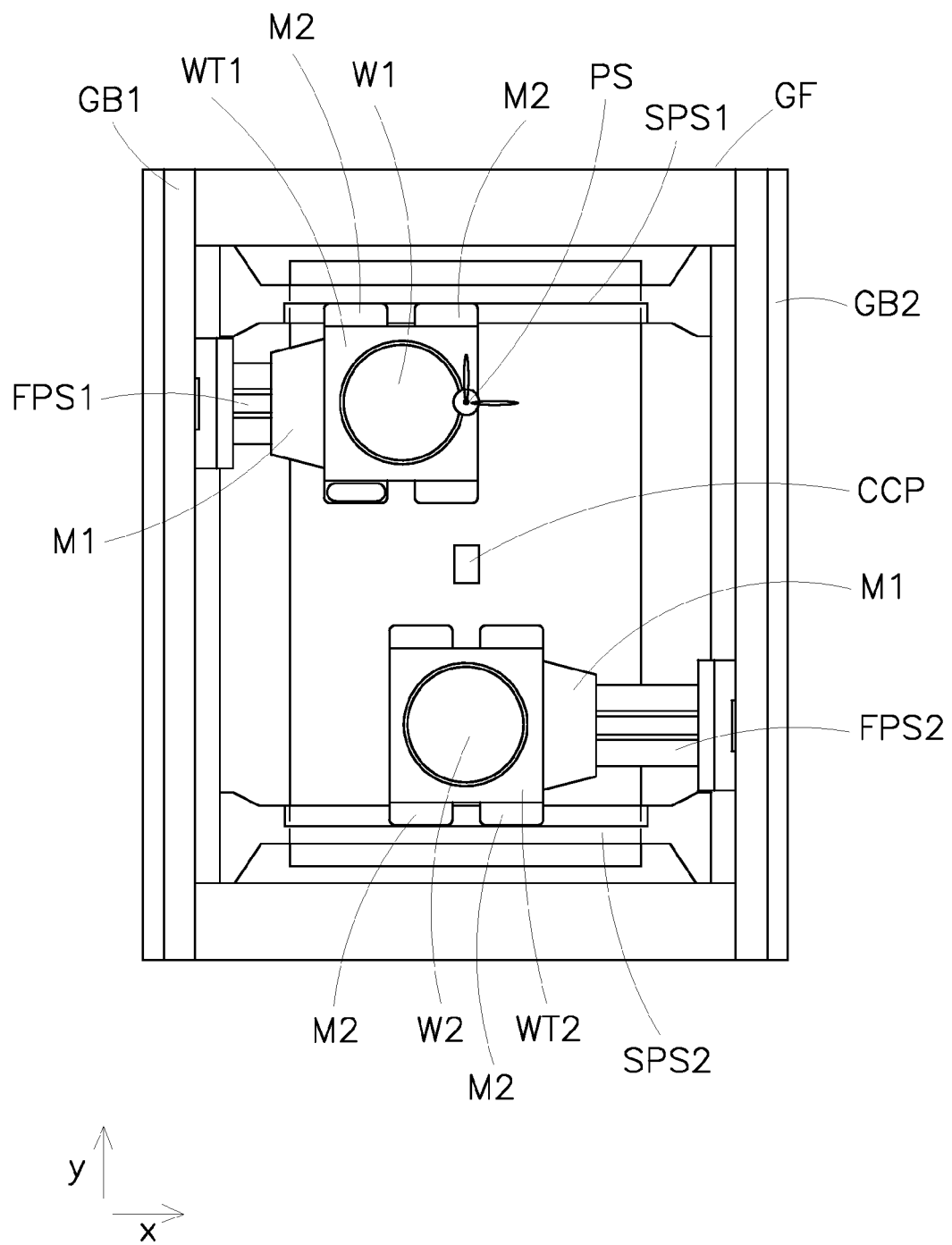
FIGS. 4A and 4B each depict a top view of a substrate table system according to an embodiment of the invention.

FIG. 4A depicts a top view of the dual stage architecture described above with reference to FIG. 3. The first and second pusher structure may be mechanically interrelated by an interlock IL, so as to keep the first and second pusher structures at a certain distance thereby possibly preventing mechanical damage due to an error in driving the first and second pusher structures synchronously.

Figure 4B:
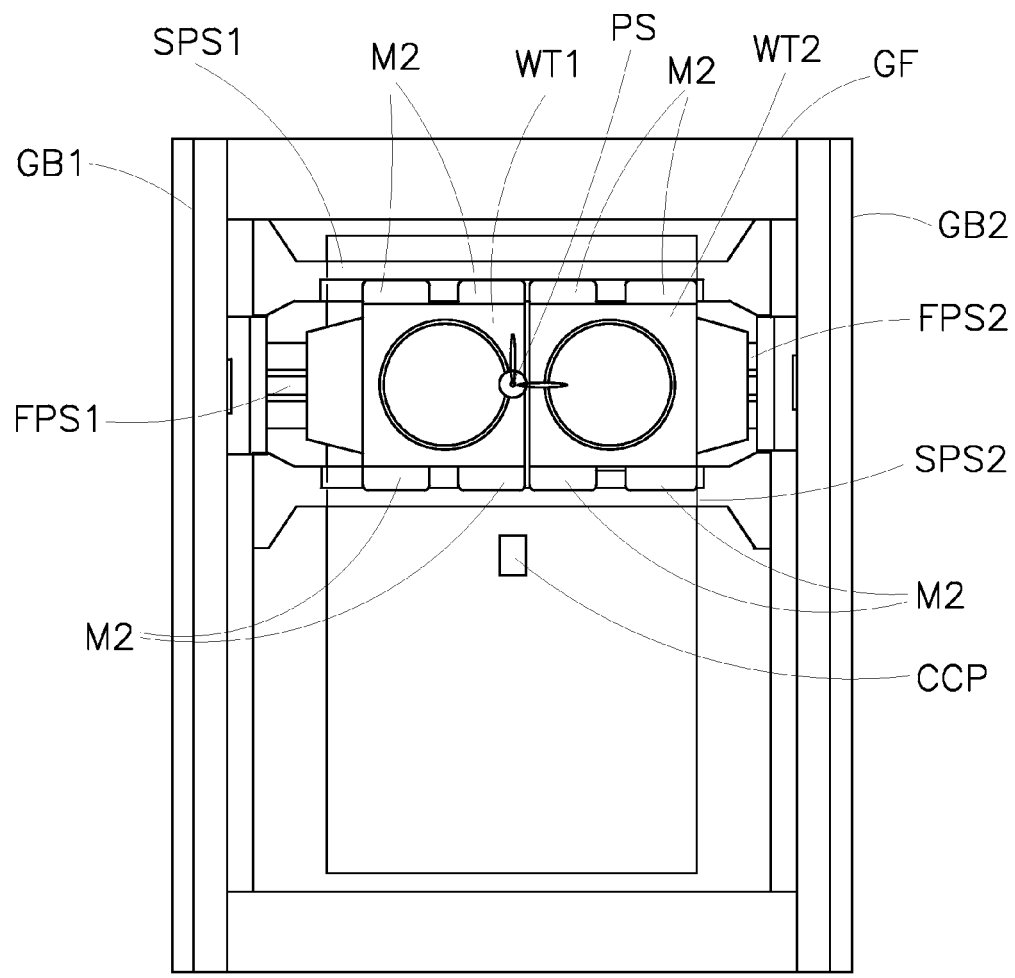

A substrate stage swap will now be described with reference to FIGS. 4A and 4B. Starting from for example apposition such as depicted in FIG. 4A, the substrate table WT2 at the measure side is moved to the expose side, the substrate tables being positioned adjacent as seen in the first (X) direction. Then, both substrate tables are moved synchronously in the first direction, so that the first substrate table (that was below the projection system at expose side) is moved away from the projection system, while the other substrate table is moved in a position under the projection system. As a result, in case of for example an immersion system whereby an immersion liquid is supplied between the substrate and a final optical element of the projection system, a fast takeover may be performed. Due to the fact that the substrate tables are provided with protrusions and corresponding coils to co-operate with both substrate tables, both substrate tables release from their second pusher structures and connect with the respective other one of the second support structures (e.g. by powering and de-powering corresponding coils of the second motor). The first substrate table may now move to the measure area, thereby the substrate tables having been swapped.

Figure 5A:
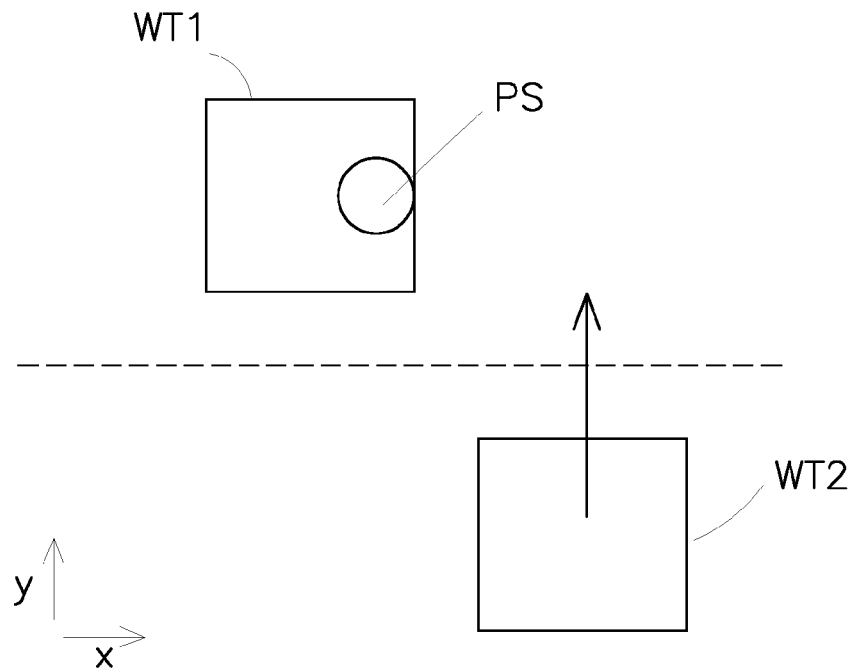
FIG. 5A-5D depict a substrate table swap method according to an embodiment of the invention.
Figure 5B:
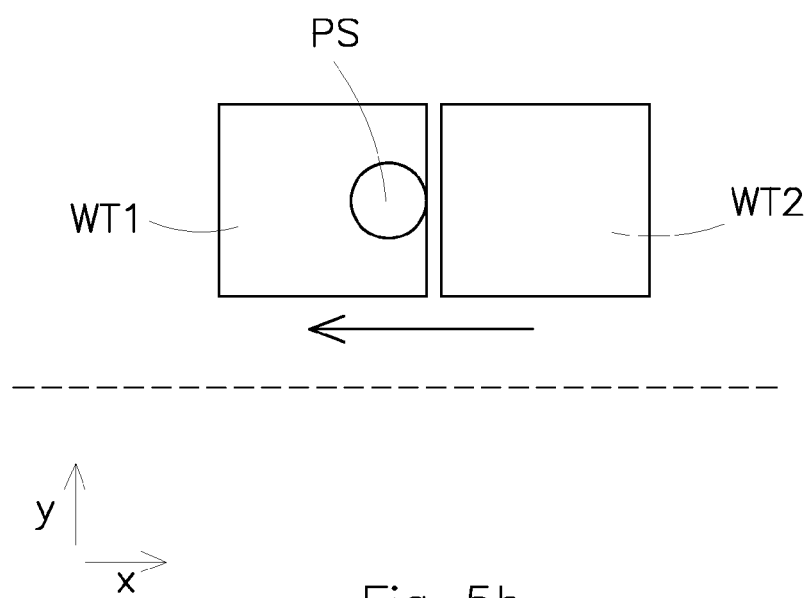
Figure 5C:
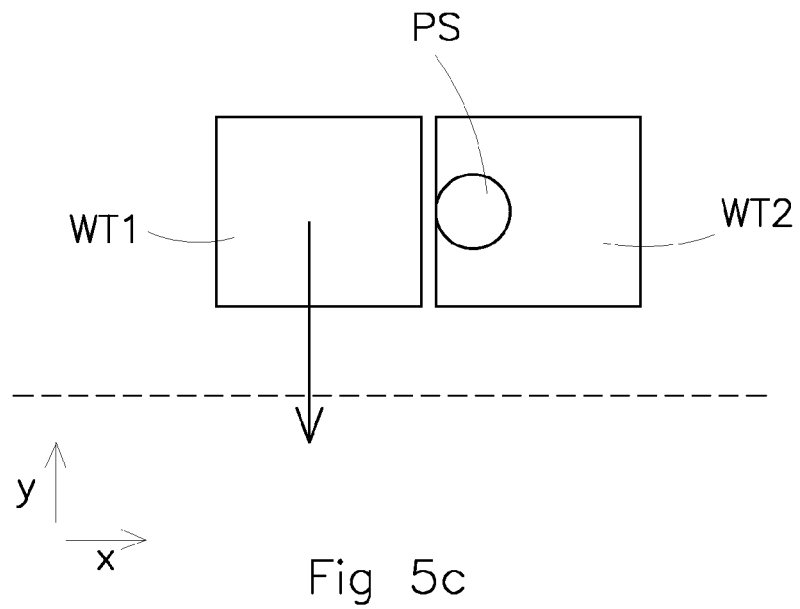
Figure 5D:
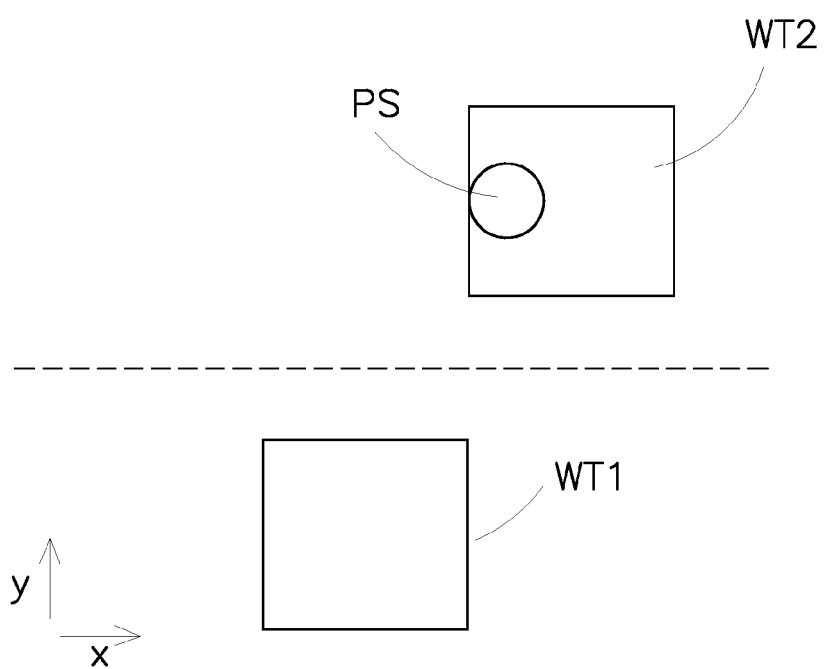

It is noted that the above described swapping scheme, whereby the first and second substrate table are positioned adjacent to each other in the first direction, synchronously move in the first direction, so that the other one of the substrate tables is positioned below the projection system, and then moving the one of the substrate tables that was below the projection system (i.e. the one where exposure was performed) to the measure area, allows to perform a fast substrate stage swap in any drive configuration (e.g. using other motor types) with a minimum additional space required for maneuvering. An example of this swapping is depicted in FIGS. 5A-5D. It is noted that the first direction is a direction parallel to a border between the measure area and the expose area, as indicated by the dotted line in FIGS. 5 A-D. FIG. 5A depicts the first substrate table WT1 being in the expose region and under the projection system (schematically indicated by PS), and the second one WT2 being in the measure region. The second substrate table WT2 moves to the expose region, a result being depicted in FIG. 5B. Both substrate tables make a simultaneous movement in the first direction, so that the second substrate table WT2 is below the projection system PS (FIG. 5C), and the first substrate table WT1 is moved to the measure area (FIG. 5D).

As briefly stated above, various motor types may be applied. An embodiment having Lorentz motors with magnets in the pusher structures and coils in the substrate table is described with reference to FIGS. 6A and 6B, while an embodiment having coils in the pusher structures and magnets in the substrate table is described with reference to FIG. 7.

Figure 4B:
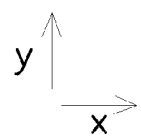
Figure 6A:
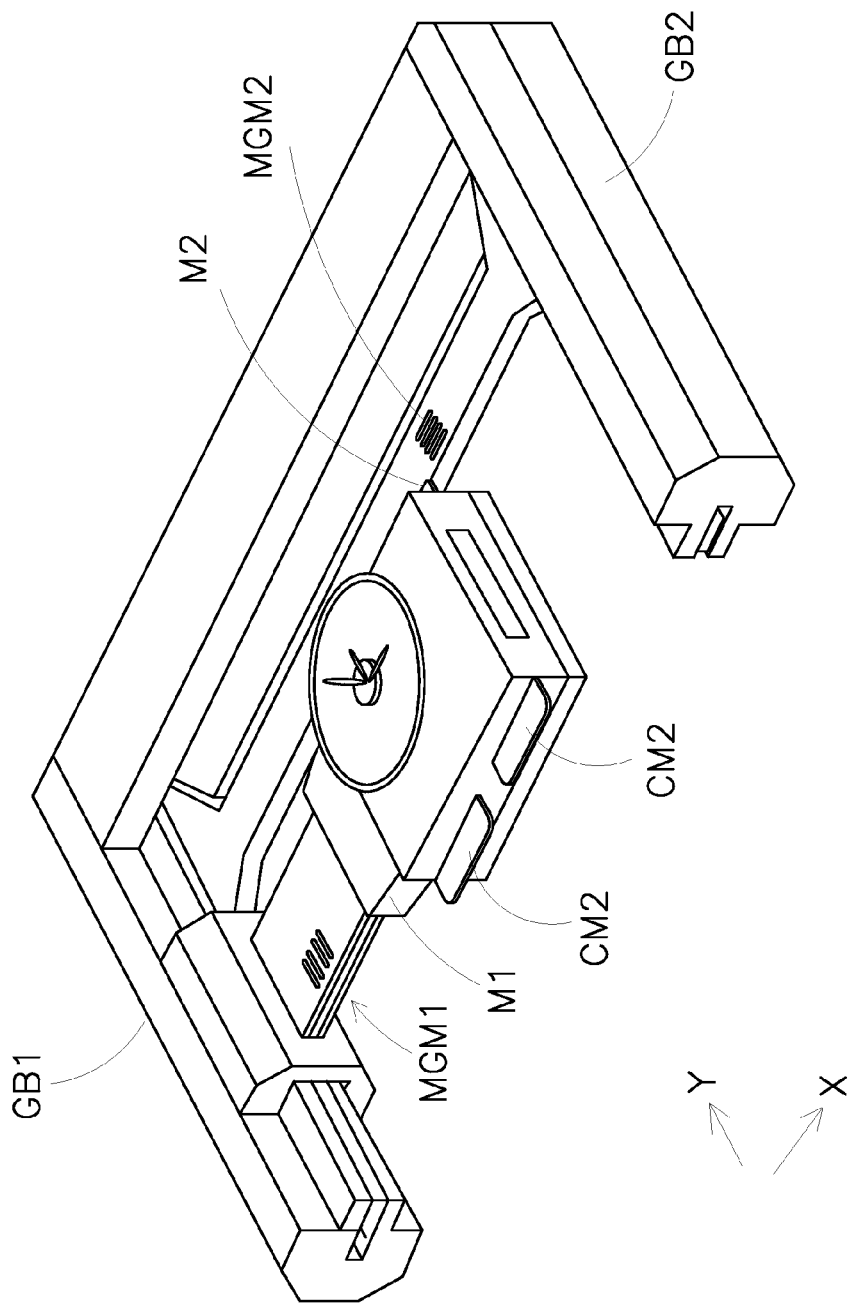
FIGS. 6A and 6B depict a perspective respectively a top view of a (part of a) substrate table system according to an embodiment of the invention.
Figure 6B:
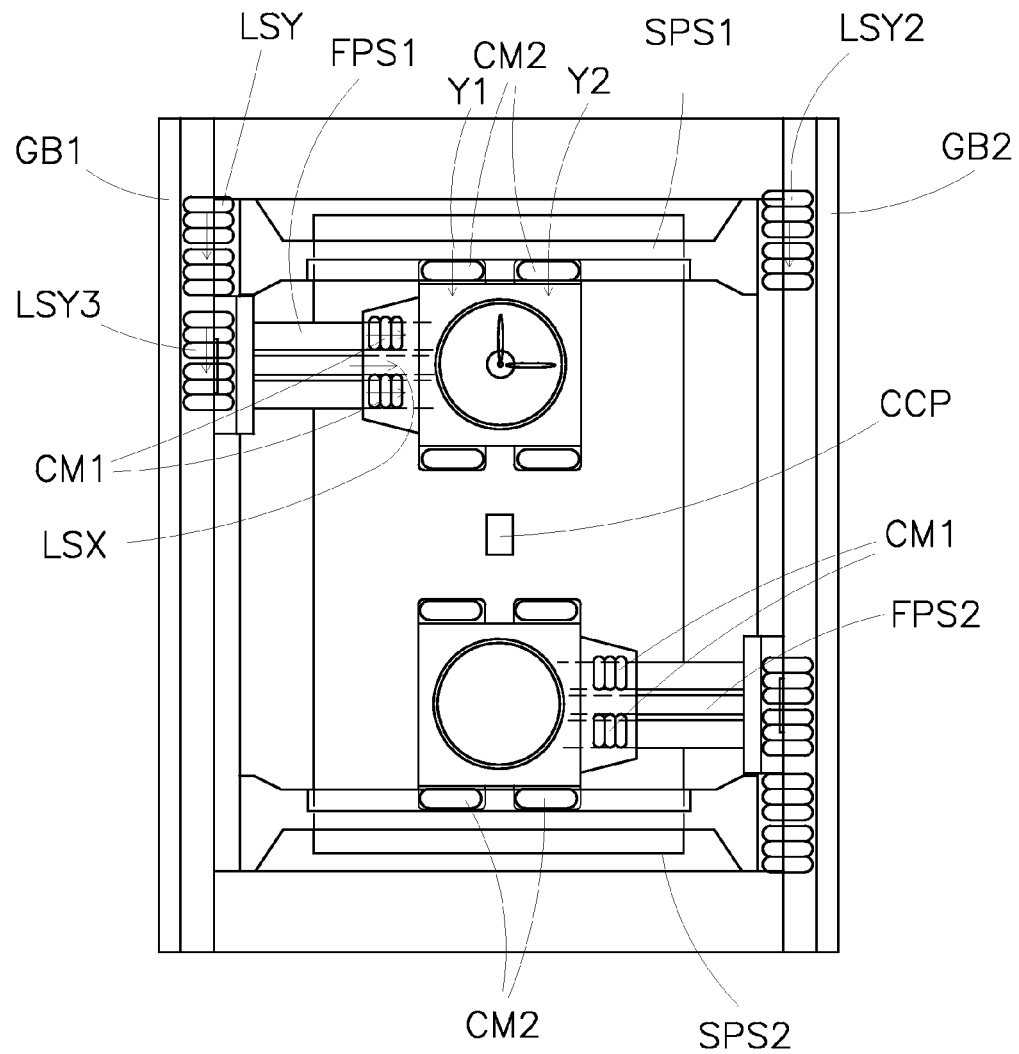
Figure 6B:
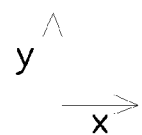

FIG. 6A depicts a perspective view of a part of a substrate table system, substantially a half of the substrate table system as described with reference to FIGS. 3 and 4. First magnets MGM1 of the first motor are provided in the first pusher structure, in this example an array of oppositely poled first magnets extends in the first direction, in order to cooperate with a coil of the first motor M1 (not shown) in order to exert a force in the first direction. Second magnets MGM2 are provided in the second pusher structure SPS, and cooperate with coils of the second motor CM2. It is noted that in the depicted embodiment, the substrate table is arranged to cooperate with the second pusher structure on both sides (as described above) in order to allow a swap and cooperation of the substrate table with the other one of the second support structures in a dual stage configuration, as described above. The coils of the second motor CM2 which are active at present, are to be understood as the ones at the side of the substrate table that faces the second support structure, so as to form the second motor M2 with the magnets MGM2. It is noted that the magnets, seen in the direction of the force generated by the motor in question, have an alternately opposite polarization. FIG. 6B depicts a top view of a same or similar configuration, depicting the corresponding coils CM1 of motor 1, and CM2 of motor 2. The motor M1 provides for a long stroke in X direction, while the motor M2 provides for a short stroke in Y direction. Similarly, coils are provided in the part of the first pusher structure FPS1 that cooperates with (corresponding magnets provided in) the guiding beam GB1 to form a long stroke motor LSY3 of the first pusher structure in Y direction. Similarly, coils at either ends of the second pusher structure SPS1 cooperate with the guiding beams to form long stroke motors LSY, LSY2 of the second pusher structure, hence of the substrate table WT1. A similar configuration is provided at the second substrate table WT2. It is noted that the first and second motor, as they each comprise dual coils extending at a distance from each other in a direction perpendicular to the direction of the force of the particular motor, may also generate a torque (e.g. in respect of the Z axis) by a differential driving of the coils in question.

Figure 7:
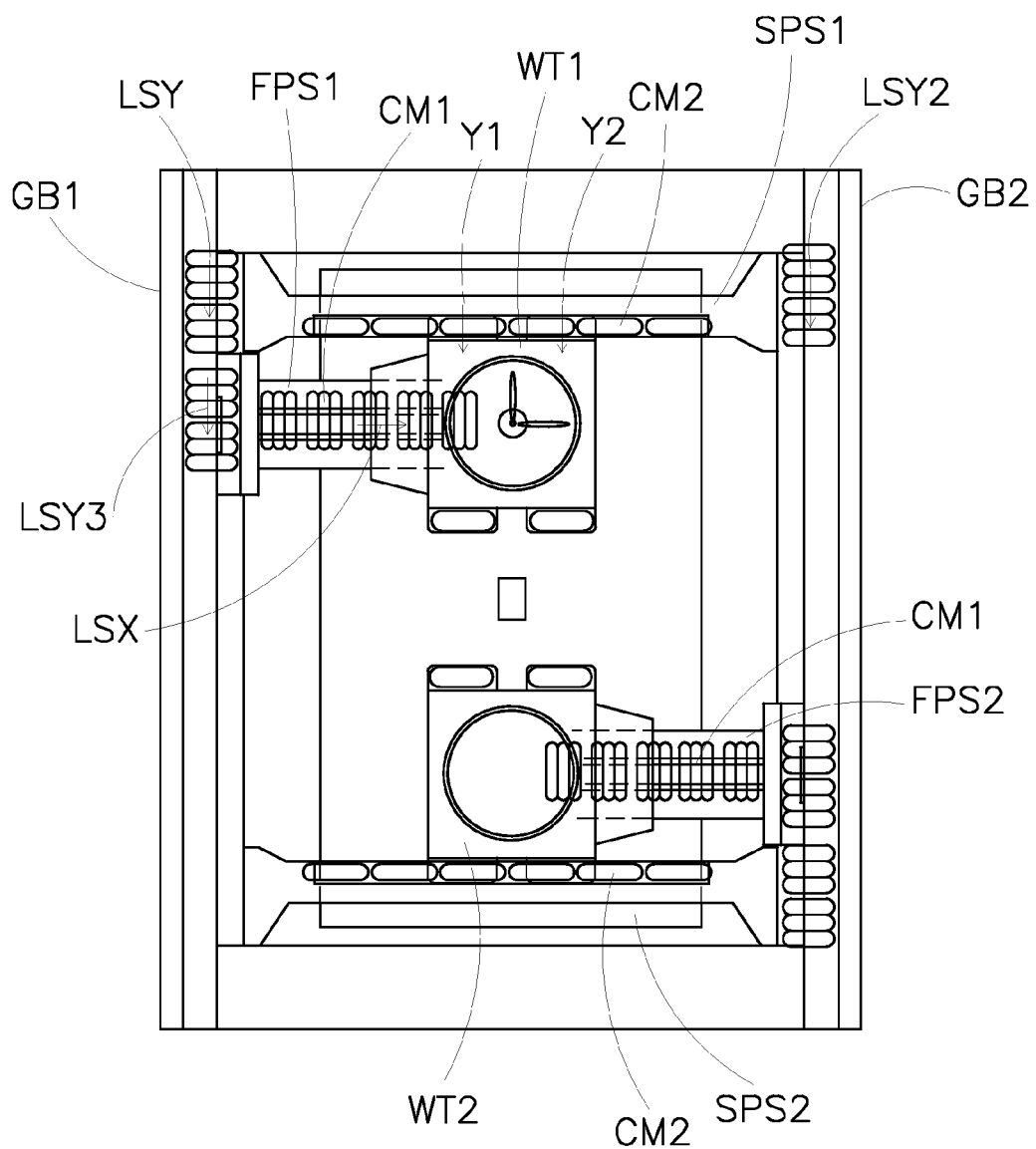
FIG. 7 depicts a top view of a substrate table system according to an embodiment of the invention.

FIG. 7 depicts a configuration wherein (for the first and second motor), the coils CM1 respectively CM2 are provided in the first and second pusher structures FPS1, FPS2, SPS1, SPS2, while the magnets (not shown here) are provided in the substrate tables, thereby providing similar motors long stroke x LSX, short stroke Y (Y1, Y2), and long stroke Y (LSY, LSY2, LSY3).

It is noted that the first and second pusher structures are, in the depicted examples, provided with recesses extending along the first direction at the sides seen in the second direction, the first and second motors for example being formed by coils and magnets in a wall of the recess, respectively in a projecting part of the substrate table that projects into the recess.

Figure 8A:
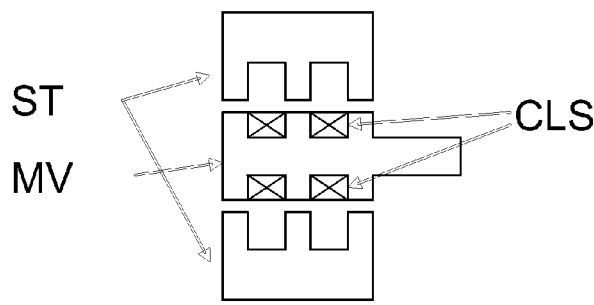
FIGS. 8A-C depict schematic views of a reluctance motor that may be applied a substrate table system according to an embodiment of the invention.

Instead of applying Lorentz motors, other motor configurations may be applied, for example a reluctance type motor, as will be explained with reference to FIGS. 8A-C. The "Y pushers" provided by the second pusher structure have to create the total force needed to move the substrate table. This may require a relatively large dissipation. Standard pull-pull reluctance actuators may not be possible because the X beam needs to be able to move away from the carrier. A reluctance motor having a Saywer-like structure may be used: each motor uses teeth in the stator (connected to the second pusher structure beam) and a coil on the mover (substrate table). Both the mover MV and the stator ST (at least partly) consist of iron or an iron containing metal alloy. A current through the coils CLS creates a force towards the equilibrium position in FIG. 8A. However, in this equilibrium position, no force may be exerted in the horizontal direction. Therefore, the motor may be used slightly out of equilibrium.

Figure 8B:
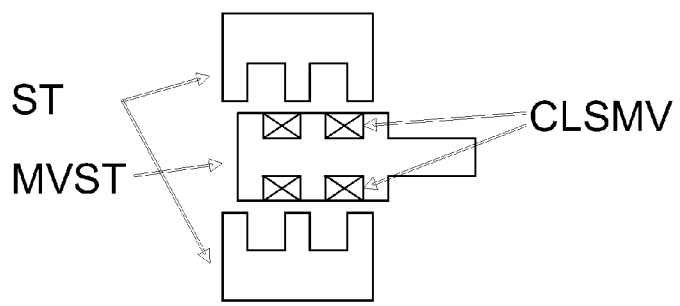
Figure 8C:
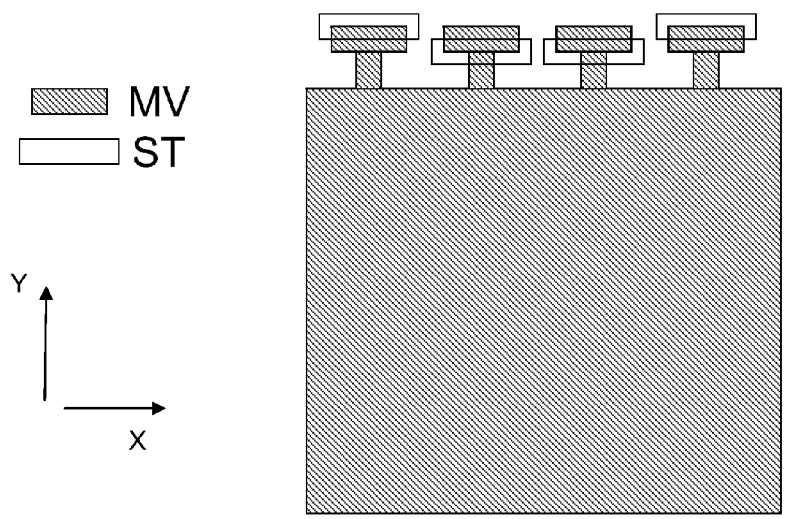

As depicted in FIG. 8B, a force on the mover towards the left can be created by a coil current. To be able to create a force both to the left and to the right, two sets of actuators are applied, as in the top view depicted in FIG. 8C. Counted from the left, the motors 1 and 4, when actuated, to drive the motor in +y direction, while motor 2 and 3, when actuated, drive the motor in −y direction. This way, a force can be applied in both directions (pull-pull concept). Such a low-power reluctance actuator may be used while still being able to release the substrate table from the X beam by disengaging the motor. A force in both +y and −y may be generated.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A substrate table system comprising a substrate table and a dual directional motor for moving the substrate table in a plane of movement, the horizontal plane of movement being defined by a first direction and a second direction perpendicular to the first direction, the dual directional motor comprising:
a first pusher structure extending in the first direction, the substrate table being movable with respect to the first pusher structure, the first pusher structure and the substrate table being arranged to cooperate so as to form a first motor arranged to exert a force between the first pusher structure and the substrate table in the first direction; and
a second pusher structure extending in the first direction, the substrate table being movable with respect to the second pusher structure along the first and second directions, the second pusher structure and the substrate table being arranged to cooperate so as to form a second motor arranged to exert a force between the second pusher structure and the substrate table in the second direction,
wherein the first and second pusher structures are movably connected to a frame,
wherein the first pusher structure is movable with respect to the frame along the second direction, and
wherein the frame comprises two parallel guiding structures extending along the second direction, the first pusher structure extending along the first direction from one of the guiding structures to a location that is substantially at a center between the guiding structures.

2. The substrate table system according to claim 1, wherein the substrate table is provided with an opening, extending along the first direction, for accommodating at least part of the first pusher structure.

3. The substrate table system according to claim 1, wherein the second pusher structure extends along the first direction from the one of the guiding frames to the other of the guiding frames.

4. The substrate table system according to claim 1, wherein a part of the first motor comprised in the first pusher structure substantially extends in the first direction along a length of the first pusher structure.

5. The substrate table system according to claim 1, wherein a part of the second motor comprised in the second pusher structure extends in the first direction along at least a same length as the length of the part of the first motor extending along the first pusher structure.

6. The substrate table system according to claim 1, wherein the first and second motor are each formed by magnets comprised in the first and the second pusher structure respectively, and coils comprised in the substrate table.

7. A lithographic apparatus, comprising two substrate table systems, each of the two substrate table systems comprising
a substrate table and a dual directional motor for moving the substrate table in a plane of movement, the horizontal plane of movement being defined by a first direction and a second direction perpendicular to the first direction, the dual directional motor comprising
a first pusher structure extending in the first direction, the substrate table being movable with respect to the first pusher structure, the first pusher structure and the substrate table being arranged to cooperate so as to form a first motor arranged to exert a force between the first pusher structure and the substrate table in the first direction; and
a second pusher structure extending in the first direction, the substrate table being movable with respect to the second pusher structure along the first and second directions, the second pusher structure and the substrate table being arranged to cooperate so as to form a second motor arranged to exert a force between the second pusher structure and the substrate table in the second direction,
wherein the first and second pusher structures are movably connected to a frame, and wherein the first pusher structure is movable with respect to the frame along the second direction,
wherein the substrate tables of the two substrate table systems are arranged between the second pusher structures of the substrate table systems.

8. The lithographic apparatus according to claim 7, wherein seen along the second direction, the first pusher structures are arranged symmetrically around a center crash pole.

9. The lithographic apparatus according to claim 7, wherein the substrate tables each comprise a respective part of the second motor at a side of the substrate table facing its second pusher structure, as well as a side of the substrate table facing the other second pusher structure.

10. The lithographic apparatus according to claim 7, being arranged to swap the substrate tables of the substrate table systems by
positioning one of the substrate tables under a projection system of the lithographic apparatus,
positioning the other one of the substrate tables in the first direction adjacent the first substrate table;
synchronously moving the first and second substrate tables in the first direction to a position wherein the other one of the substrate tables is positioned under the projection system,
establishing for each substrate table, a connection between the respective substrate table and the second pusher structure of the other substrate table system,
releasing for each substrate table, a connection between the respective substrate table and the second pusher structure to which it was connected before the swap.

11. A method of swapping a substrate table in a dual stage lithographic apparatus according to claim 9 comprising a measurement area and an exposure area, a border between the measurement area and the exposure area extending in a first direction, the method comprising:
positioning one of the substrate tables of the two substrate table systems under a projection system of the lithographic apparatus,
moving the other one of the substrate tables of the two substrate table systems from the measurement area to the exposure area, and positioning the other one of the substrate tables of the two substrate table systems in the first direction adjacent the first substrate table;
synchronously moving the substrate tables of the two substrate table systems in the first direction to a position wherein the other one of the substrate tables of the two substrate table systems is positioned under the projection system,
moving the one of the substrate tables of the two substrate table systems from the exposure area to the measurement area.

* * * * *